(12) United States Patent
Shen et al.

(10) Patent No.: US 7,799,634 B2
(45) Date of Patent: Sep. 21, 2010

(54) METHOD OF FORMING NANOCRYSTALS

(75) Inventors: Jinmiao J. Shen, Austin, TX (US);
Horacio P. Gasquet, Austin, TX (US);
Sung-Taeg Kang, Austin, TX (US);
Marc A. Rossow, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 12 days.

(21) Appl. No.: 12/339,262

(22) Filed: Dec. 19, 2008

(65) Prior Publication Data

US 2010/0159651 A1     Jun. 24, 2010

(51) Int. Cl.
*H01L 21/336* (2006.01)

(52) U.S. Cl. .......... 438/257; 257/E21.21; 257/E21.423; 257/E21.679

(58) Field of Classification Search ................. 438/257; 257/314, 315, 316, E21.21, E21.423, E21.679
See application file for complete search history.

(56) References Cited

U.S. PATENT DOCUMENTS

| | | | |
|---|---|---|---|
| 6,297,095 | B1 | 10/2001 | Muralidhar et al. |
| 6,320,784 | B1 | 11/2001 | Muralidhar et al. |
| 6,455,372 | B1 | 9/2002 | Weimer |
| 6,784,103 | B1 | 8/2004 | Rao et al. |
| 6,808,986 | B2 | 10/2004 | Rao et al. |
| 6,955,965 | B1 * | 10/2005 | Halliyal et al. .............. 438/257 |
| 6,958,265 | B2 | 10/2005 | Steimle et al. |
| 6,964,902 | B2 | 11/2005 | Steimle et al. |
| 7,091,089 | B2 | 8/2006 | Steimle |
| 7,091,130 | B1 | 8/2006 | Rao et al. |
| 7,183,159 | B2 | 2/2007 | Rao et al. |
| 7,186,616 | B2 | 3/2007 | Rao et al. |
| 7,361,543 | B2 | 4/2008 | Steimle et al. |
| 7,361,567 | B2 | 4/2008 | Rao et al. |
| 7,416,945 | B1 | 8/2008 | Muralidhar et al. |
| 7,432,158 | B1 | 10/2008 | Rao et al. |
| 7,445,984 | B2 | 11/2008 | Rao et al. |
| 7,517,747 | B2 | 4/2009 | Muralidhar et al. |
| 2006/0046384 | A1 | 3/2006 | Joo et al. |
| 2006/0189079 | A1 | 8/2006 | Merchant |

* cited by examiner

*Primary Examiner*—Quoc D Hoang
(74) *Attorney, Agent, or Firm*—Daniel D. Hill; James L. Clingan, Jr.

(57) ABSTRACT

Nanocrystals are formed over an insulating layer by depositing a semiconductor layer over the insulating layer. The semiconductor layer is annealed to form a plurality of globules from the semiconductor layer. The globules are annealed using oxygen. Semiconductor material is deposited on the plurality of globules to add semiconductor material to the globules. After depositing the semiconductor material, the globules are annealed to form the nanocrystals. The nanocrystals can then be used in a storage layer of a non-volatile memory cell, especially a split-gate non-volatile memory cell having a select gate over the nanocrystals and a control gate adjacent to the select gate.

20 Claims, 4 Drawing Sheets

METHOD OF FORMING NANOCRYSTALS

FIELD OF THE INVENTION

This invention relates generally to semiconductor devices, and more specifically, to forming nanocrystals.

BACKGROUND

Electrically erasable programmable read only memory (EEPROM) structures are commonly used in integrated circuits for non-volatile data storage. EEPROM device structures commonly include a polysilicon floating gate formed over a tunnel dielectric, which is formed over a semiconductor substrate, to store charge. As device dimensions and power supply voltages decrease, the thickness of the tunnel dielectric cannot correspondingly decrease in order to prevent data retention failures. An EEPROM device using isolated silicon nanocrystals or nanoclusters as a replacement to the floating gate does not have the same vulnerability to isolated defects in the tunnel dielectric and thus, permits scaling of the tunnel dielectric and the operating voltage without compromising data retention.

In order to have a significant memory effect as measured by the threshold voltage shift of the EEPROM device, it is necessary to have a high density of silicon nanoclusters of approximately 1E12 nanoclusters per $cm^2$. One method to achieve such a density of nanoclusters is to fabricate the nanoclusters using chemical vapor deposition (CVD) using disilane ($Si_2H_6$). However, the resulting nanoclusters vary in size distribution, which decreases reliability of the EEPROM devices. To improve reliability, a method to form nanoclusters with narrow size distributions at desired densities is needed.

BRIEF DESCRIPTION OF THE DRAWINGS

The present invention is illustrated by way of example and is not limited by the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

Figure 1:
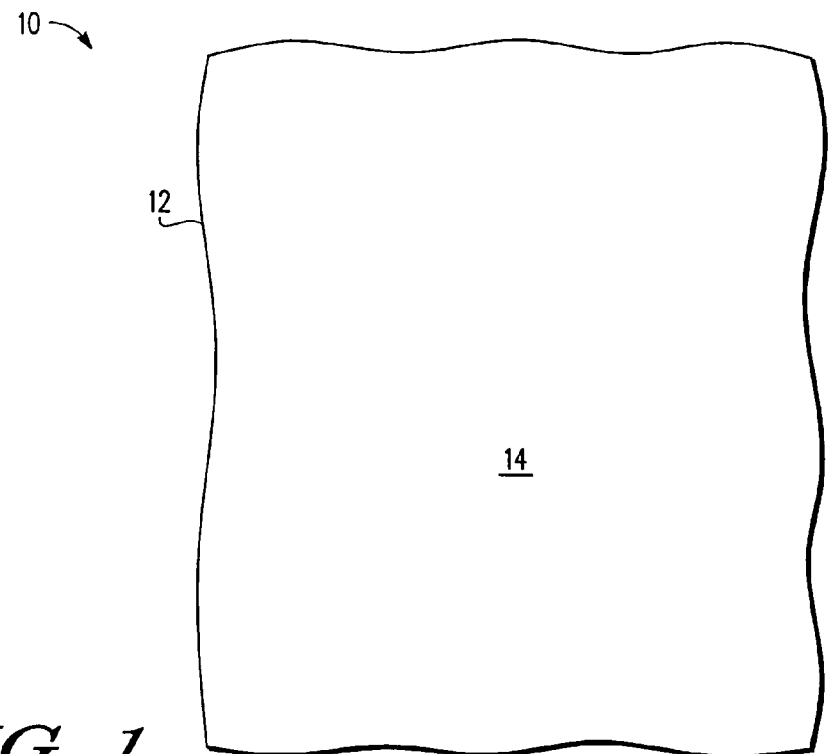
FIG. 1 illustrates a top view of a portion of a semiconductor substrate having an overlying dielectric layer in accordance with an embodiment of the present invention.
Figure 7:
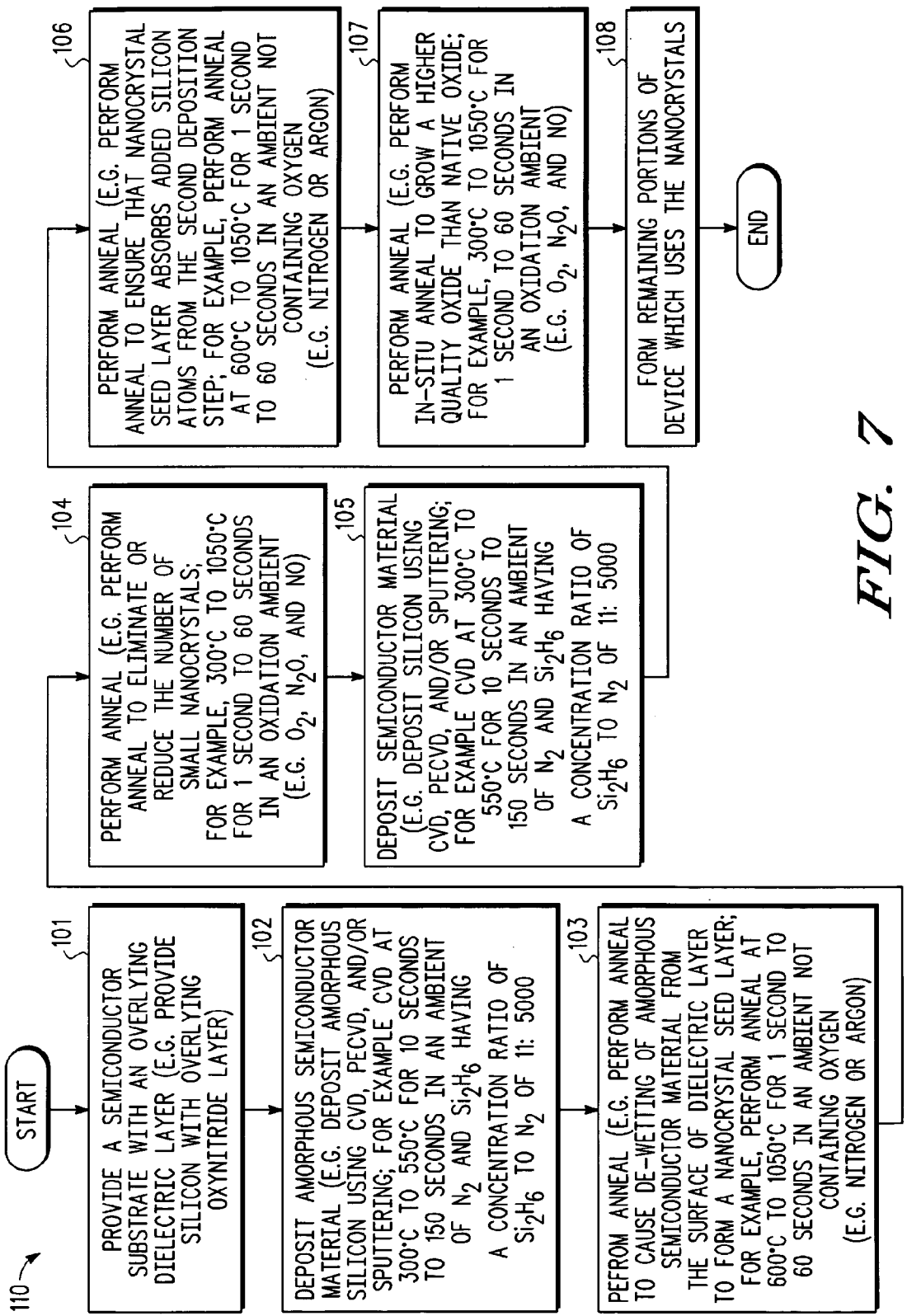
FIG. 7 illustrates, in flow diagram form, a method for forming a device using nanocrystals in accordance with an embodiment of the present invention.

Referring to FIG. 1, in one embodiment, a method of forming nanoclusters includes providing a semiconductor structure 10 having a substrate 12 (e.g. a semiconductor substrate) and forming a dielectric layer 14 overlying the substrate 12 (see step 101 in FIG. 7). Note that for some embodiments, no prior chemical pre-treatment of this dielectric layer is performed. In fact, for some embodiments, prior chemical pre-treatment of this dielectric layer is not necessary and/or is not desirable.

Figure 2:
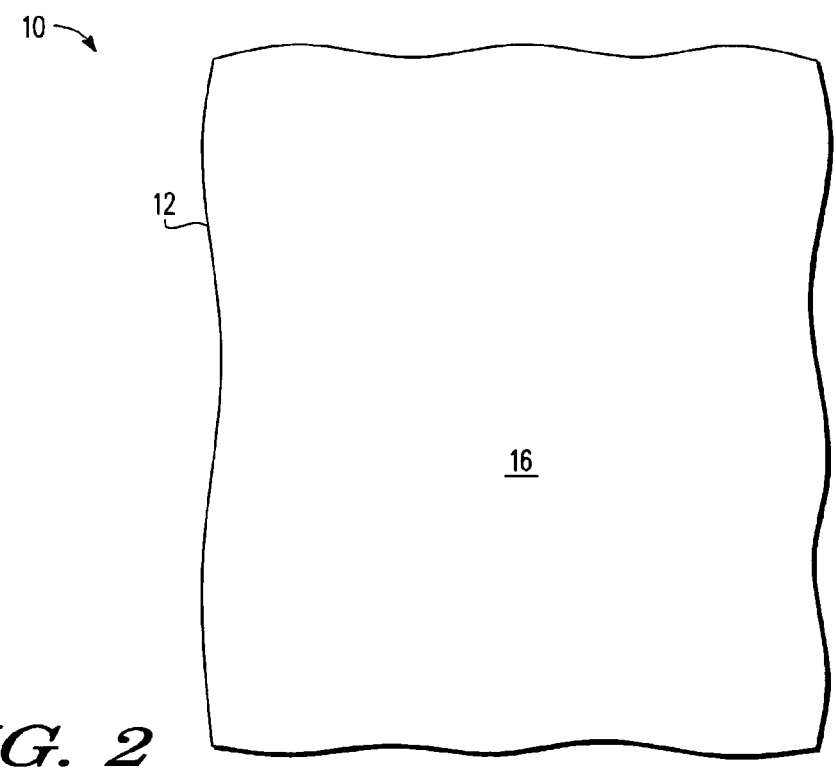
FIG. 2 illustrates a top view of the semiconductor substrate of FIG. 1 when exposed to a first flux of atoms in accordance with an embodiment of the present invention.

Referring to FIG. 2 and step 102 in FIG. 7, in one embodiment, the substrate 12 is then placed in a deposition chamber and a first precursor gas is flowed into the deposition chamber during a first deposition step (see step 102) to form a thin amorphous silicon layer 16 on the dielectric layer 14. This deposition step may be performed using chemical vapor deposition (CVD), plasma enhanced chemical vapor deposition (PECVD), and/or sputtering. Note that atomic layer deposition (ALD) may be used, and is considered as a type of CVD. In one embodiment, CVD is used with a temperature in the range of 300-550 degrees Celsius, for 10-150 seconds, in an ambient of nitrogen ($N_2$) and disilane ($Si_2H_6$) having a concentration ratio of disilane to nitrogen of 11:5000. In an alternate embodiment, CVD is used with a temperature in the range of 450-500 degrees Celsius, for 80-120 seconds, in an ambient of nitrogen ($N_2$) and disilane ($Si_2H_6$) having a concentration ratio of disilane to nitrogen of 11:5000.

Note that the deposition time will determine the thickness of the deposited layer 16 of amorphous silicon. In one embodiment, the amorphous silicon layer 16 may have a thickness in the range of 10-100 Angstroms. In an alternate embodiment, the amorphous silicon layer 16 may have a thickness in the range of 20-50 Angstroms. In yet another embodiment, the amorphous silicon layer 16 may have a thickness in the range of 30-40 Angstroms. Note that if the deposition temperature is too high, annealing and formation of nanocrystals may occur during the deposition step 102 and it may be more difficult to control the thickness of the amorphous silicon layer 16. By using disilane or trisilane gas, a lower temperature and a lower deposition rate may be used, thus allowing better control of the thickness of the amorphous silicon layer 16. Note that other concentration ratios of disilane or trisilane to nitrogen may be used, so long as a sufficient source of silicon atoms is provided. In alternate embodiment, different ambient gases and different concentration ratios may be used.

Figure 3:
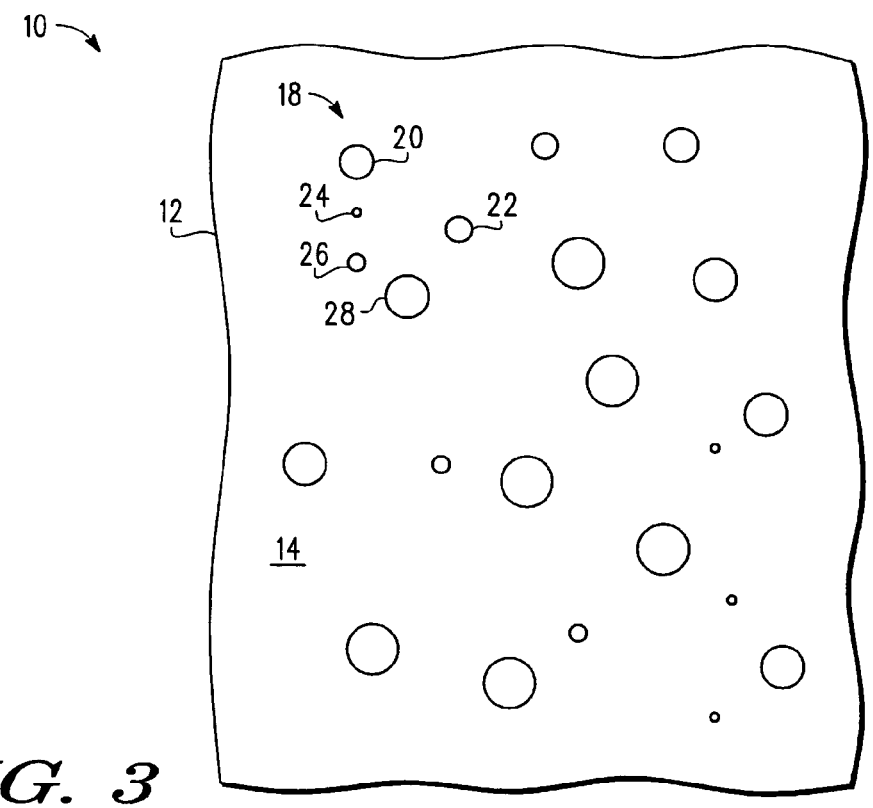
FIG. 3 illustrates a top view of the semiconductor substrate of FIG. 2 after a first anneal in accordance with an embodiment of the present invention.

Referring to FIG. 3 and step 103 in FIG. 7, in one embodiment, substrate 12 is placed in an anneal chamber (e.g. rapid thermal anneal chamber) without being exposed to ambient air (i.e. to perform an in-situ anneal). In one embodiment, this first anneal causes de-wetting of the amorphous silicon layer 16 from the surface of dielectric layer 14 to form a silicon globule seed layer 18. In this embodiment, the thermodynamics of surface tension results in a dewetting process, wherein the spacing between silicon globules is a function of the initial thickness of the amorphous silicon layer 16. In one embodiment, the anneal is performed at a temperature in the range of 600-1050 Celsius, for a time in the range of 1-60 seconds, in an ambient which does not contain oxygen (e.g. one or more gases which do not contain oxygen). For example, in one embodiment, the ambient may be nitrogen, an inert gas such as argon, or a combination thereof. Note that the temperature used for this first anneal may have a significant impact on the density of the silicon globules 18. For example, if a higher density of globules 18 is desired, a lower temperature in the range of 600-850 Celsius, for a time in the range of 1-60 seconds, in an ambient which does not contain oxygen (e.g. one or more gases which do not contain oxygen) may be used. In an alternate embodiment, if the highest density of globules is desired, the lowest temperature range (600-700 Celsius), for a time in the range of 1-60 seconds, in an ambient which does not contain oxygen (e.g. one or more gases which do not contain oxygen) may be used. Note that an increased anneal time (e.g. more than 60 seconds) may be used, but will not generally have a significant impact on the silicon globules 18. Referring to FIG. 3, nanocrystals 18 include individual silicon globule 20, 22, 24, 26, and 28. In one embodiment the atomic arrangement within the globule is crystalline. In another embodiment, the atomic arrangement within the globule could be amorphous. Note that the term nanocrystal will be use herein for silicon globules of either crystalline or amorphous atomic arrangement.

Figure 4:
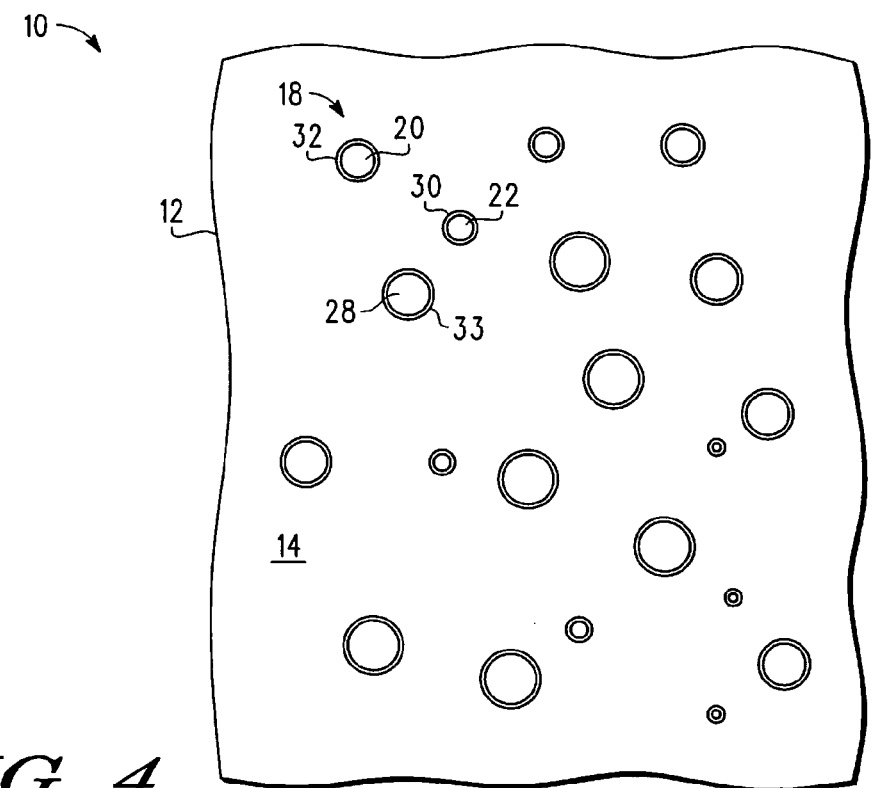
FIG. 4 illustrates a top view of the semiconductor substrate of FIG. 3 after a second anneal in accordance with an embodiment of the present invention.

Referring to FIG. 4 and step 104 in FIG. 7, in one embodiment, substrate 12 is kept in the same anneal chamber and a second in-situ anneal is performed. Alternate embodiments may instead use a separate anneal chamber for this second anneal. Note that in such alternate embodiments, substrate 12 may be exposed to ambient air between the first and second anneals. In one embodiment, this second anneal (e.g. step 104) eliminates or reduces the number of small nanocrystals (e.g. nanocrystals 24 and 26 of FIG. 3) among nanocrystals 18.

In one embodiment, the second anneal (step 104) is performed at a temperature in the range of 300-1050 Celsius, for a time in the range of 1-60 seconds, in an oxidation ambient which does contain oxygen (e.g. one or more gases which do contain oxygen). For example, in one embodiment, the ambient may be $O_2$, $N_2O$, or NO, or any combination thereof. Alternate embodiments may use a different oxidation ambient, such as for example, combining one or more oxygen containing gases with one or more other non-oxygen containing gases. Note that the temperature used for this second anneal may have an impact on the density of the nanocrystals 18 through reducing the number of small nanocrystals. For example, a higher temperature and/or a longer anneal time will further reduce the number of small nanocrystals. Thus, to decrease the number of small nanocrystals, a higher temperature in the range of 750-1050 Celsius, for a time in the range of 1-60 seconds, in an ambient which does contain oxygen (e.g. one or more gases which do contain oxygen) may be used. In an alternate embodiment, a temperature range (600-850 Celsius), for a time in the range of 1-60 seconds, in an ambient which does contain oxygen (e.g. one or more gases which do contain oxygen) may be used. Note that an increased anneal time (e.g. more than 60 seconds) will cause more and more nanocrystals 18 to oxidize. This may be detrimental to the density of the nanocrystals 18.

Referring to FIG. 4, nanocrystals 18 include individual nanocrystals 20, 22, 24, and 26. Nanocrystal 24 is a small nanocrystal that has been fully oxidized by the second anneal (see step 104 in FIG. 7). Some nanocrystals may be absorbed by or combined with other nearby nanocrystals (e.g. nanocrystal 26 may alternately be absorbed by nanocrystal 28 instead of being fully oxidized). After the second anneal, nanocrystal 20 has an outside oxide or oxynitride layer 32; nanocrystal 22 has an outside oxide or oxynidtride layer 30; and nanocrystal 28 has an outside oxide or oxynidtride layer 33. Note that the partial oxidation of nanocrystals 20, 22, and 28 results in these nanocrystals becoming smaller, while the oxidation of small nanocrystals (e.g. 24 and 26) results in these small nanocrystals being fully oxidized (e.g. now being comprised of silicon oxide). And, as a result, the size distribution of the remaining nanocrystals 18 is improved.

Figure 5:
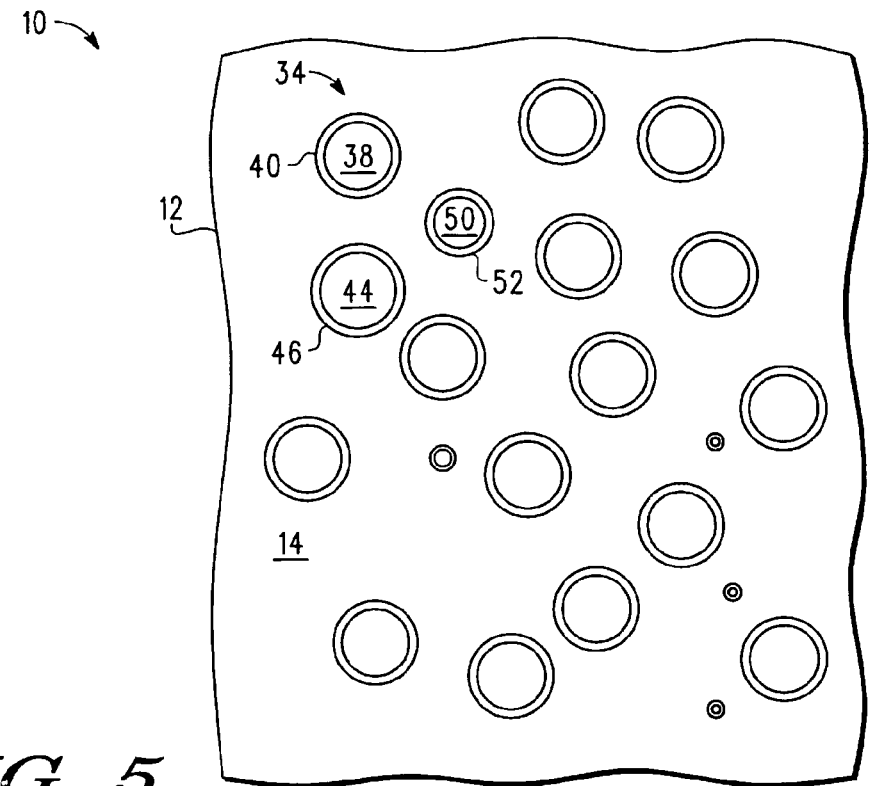
FIG. 5 illustrates a top view of the semiconductor substrate of FIG. 4 exposed to a second flux of atoms and after a third anneal in accordance with an embodiment of the present invention.

Referring to FIG. 5 and step 105 in FIG. 7, in one embodiment, a second deposition of semiconductor material is then performed. In one embodiment, the substrate 12 is again placed in a deposition chamber and a second precursor gas is flowed into the deposition chamber during this second deposition step (see step 105). This deposition step may be performed using chemical vapor deposition (CVD), plasma enhanced chemical vapor deposition (PECVD), and/or sputtering. Note that atomic layer deposition (ALD) may be used, and is considered as a type of CVD. In one embodiment, CVD is used with a temperature in the range of 300-550 degrees Celsius, for 10-150 seconds, in an ambient of nitrogen ($N_2$) and disilane ($Si_2H_6$) having a concentration ratio of disilane to nitrogen of 11:5000. In an alternate embodiment, CVD is used with a temperature in the range of 400-500 degrees Celsius, for 80-120 seconds, in an ambient of nitrogen ($N_2$) and disilane ($Si_2H_6$) having a concentration ratio of disilane to nitrogen of 11:5000.

Still referring to FIG. 5 and step 105 in FIG. 7, note that the deposition time, the deposition temperature, or a combination of deposition time and deposition temperature will determine the size and the coverage of the nanocrystals 18 after subsequent annealing (see annealing steps 106 and 107). Note that other concentration ratios of disilane to nitrogen may be used, so long as a sufficient source of silicon atoms is provided. In alternate embodiment, different ambient gases and different concentration ratios may be used.

Referring to FIG. 5 and step 106 in FIG. 7, in one embodiment, substrate 12 is then placed in an anneal chamber (e.g. rapid thermal anneal chamber) without being exposed to ambient air (i.e. to perform an in-situ anneal). In one embodiment, this third anneal (step 106) ensures that the nanocrystal seed layer 18 absorbs added silicon atoms from the second deposition step (i.e. step 105 in FIG. 7). This absorbing causes nanocrystals 18 to become larger. Note that these larger nanocrystals 34 in FIG. 5 are the same nanocrystals as nanocrystals 18 in FIG. 4, only after the deposition step 105 and the anneal step 106 nanocrystals 18 are now larger (thus the new reference number 34). As the nanocrystals 18 become larger (i.e. now nanocrystals 34), the coverage of the nanocrystals increases. For example, in one embodiment, the density of nanocrystals 34 is at least (i.e. is greater than or equal to) approximately $10^{12}$ globules/centimerter$^2$. Note that for one embodiment, a combination of the thickness of the amorphous silicon layer 16 deposited in step 102 of FIG. 7, along with one or more anneal parameters (e.g. anneal temperature in step 103, and anneal temperature and ambient gas in step 104), affect the resulting density of nanocrystals 34 (e.g. see end of step 106 in FIG. 7). In one embodiment, a nanocrystal coverage of at least 50 percent is achieved after step 106. Note that FIG. 5 illustrates structure 10 after both steps 105 and 106 of FIG. 7 have been performed.

In one embodiment, the third anneal (see step 106 in FIG. 7) is performed at a temperature in the range of 600-1050 Celsius, for a time in the range of 1-60 seconds, in an ambient which does not contain oxygen (e.g. one or more gases which do not contain oxygen). For example, in one embodiment, the ambient may be nitrogen, an inert gas such as argon, or a combination thereof. Note that the temperature used for this third anneal, in conjunction with the amount of semiconductor material deposited in step 105, will have a significant impact on the coverage and size of the nanocrystals 18 as they grow to larger nanocrystals 34. For example, in one embodiment, if larger nanocrystals 34 and higher coverage is desired, more semiconductor material deposited in step 105 and a lower temperature in the range of 600-850 Celsius, for a time in the range of 1-60 seconds, in an ambient which does not contain oxygen (e.g. one or more gases which do not contain oxygen) may be used. Note that an increased anneal time (e.g. more than 60 seconds) may be used, but will not generally have a significant impact on the nanocrystals 34. Referring to FIGS. 3, 4, and 5, nanocrystal 38 includes globule 20, nanocrystal 44 includes globule 28, and nanocrystal 50 includes globule 22.

In one embodiment, the nanocrystals 34 of FIG. 5 may have an average diameter of approximately 200 Angstroms, or alternately an average diameter at least equal to 170 Angstroms. In an alternate embodiment, the nanocrystals 34 may have an average diameter in a range from approximately 140 Angstrom to approximately 220 Angstroms.

Referring to FIG. 5 and step 107 in FIG. 7, in one embodiment, substrate 12 is kept in the same anneal chamber and a fourth in-situ anneal is performed. Alternate embodiments may instead use a separate anneal chamber for this fourth anneal (step 107). Note that in such alternate embodiments, substrate 12 may be exposed to ambient air between the third and fourth anneals. In one embodiment, this fourth anneal results in the growth of a higher quality oxide or oxynitride rather than the growth of native oxide that would result from exposure to ambient air.

In one embodiment, the fourth anneal (see step 107 in FIG. 7) is performed at a temperature in the range of 300-1050 Celsius, for a time in the range of 1-60 seconds, in an oxidation ambient which does contain oxygen (e.g. one or more gases which do contain oxygen). For example, in one embodiment, the ambient may be $O_2$, $N_2O$, or NO, or any combination thereof. Alternate embodiments may use a different oxidation ambient, such as for example, combining one or more oxygen containing gases with one or more other non-oxygen containing gases. Note that an increased anneal time (e.g. more than 60 seconds) will cause more and more nanocrystals 34 to oxidize. This may be detrimental to the size of the nanocrystals 34.

Still referring to FIG. 5 (after step 106 of FIG. 7), nanocrystals 34 include individual nanocrystals 38, 44, and 50. Note that nanocrystals 24 and 26 from FIG. 3 have been fully oxidized and are no longer shown in FIG. 5. After the third anneal (step 106), nanocrystal 38 has an outside oxide or oxynitride layer 40; nanocrystal 44 has an outside oxide or oxynitride layer 46; and nanocrystal 50 has an outside oxide or oxynitride layer 52.

Figure 6:
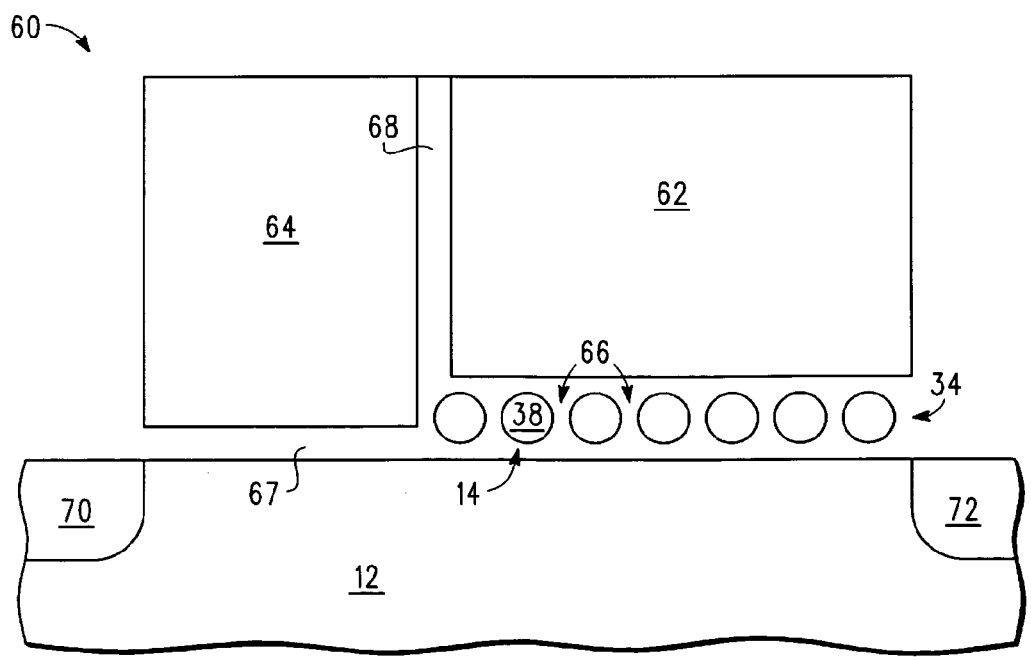
FIG. 6 illustrates a cross-sectional view of the semiconductor substrate of FIG. 5 after a second anneal and after forming the remaining portions of a non-volatile memory cell in accordance with an embodiment of the present invention.

Referring to FIG. 6 and step 108 in FIG. 7, in one embodiment a non-volatile memory (NVM) cell 60 is formed comprising a control gate 62 and a select gate 64 having an insulating layer 68 formed between control gate 62 and select gate 64. A first source/drain region 70 and a second source/drain region 72 are formed in substrate 12. Nanocrystals 36 are encompassed by overlying and fill oxide 66 as well as dielectric layer 14. Insulating layer 67 is interposed between select gate 64 and substrate 12. In one embodiment, NVM cell 60 is part of a semiconductor device 10. Although FIG. 6 illustrates nanocrystals 34 as being used in a non-volatile memory cell 60, alternate embodiments may use nanocrystals 34 in any desired and appropriate semiconductor device.

By now it should be appreciated that there has been provided a deposition and anneal process comprising one or more oxidation anneals. In one embodiment, some of the annealing steps may be performed in the presence of different ambient gases without breaking vacuum. The method allows for increased nanocrystal coverage, density, and size. The increased coverage, due to increased density and/or size, increases the endurance of NVM bitcells (see FIG. 6) which use the nanocrystals 34. This in turn improves the reliability of the semiconductor device 10, especially for memory cells programmed by hot carrier injection where the programmed charge is stored in a very small number of nanoclusters over the drain region.

In the foregoing specification, the invention has been described with reference to specific embodiments. However, one of ordinary skill in the art appreciates that various modifications and changes can be made without departing from the scope of the present invention as set forth in the claims below. For example, although only one deposition process was used to form the globules, a two-step or multi-step deposition process can be used. Accordingly, the specification and figures are to be regarded in an illustrative rather than a restrictive sense, and all such modifications are intended to be included within the scope of the present invention.

Moreover, the terms "front", "back", "top", "bottom", "over", "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms "a" or "an", as used herein, are defined as one or more than one. The term "plurality", as used herein, is defined as two or more than two. The term another, as used herein, is defined as at least a second or more.

ADDITIONAL TEXT

1. A method of making nanocrystals for example (34) on an insulating layer for example (14), comprising:
- for example (102) depositing a semiconductor layer for example (16) on the insulating layer;
- for example (103) annealing the semiconductor layer to form a plurality of globules for example (18) from the semiconductor layer;
- for example (104) annealing the globules from the semiconductor layer using oxygen for example (see FIG. 4);
- for example (105) depositing semiconductor material on the plurality of globules to add semiconductor material to the globules; and
- after depositing the semiconductor material, for example (106) annealing the globules to form the nanocrystals for example (34) for example (see FIG. 5).

2. The method of statement 1 or any other appropriate statement herein, further comprising, after the step of for example (103 or 106) annealing the globules to form the nanocrystals, for example (105) annealing the nanocrystals for example (34) using oxygen for example (see FIG. 5).

3. The method of statement 2 or any other appropriate statement herein, wherein the step of annealing the globules for example (18) from the semiconductor layer using oxygen is further characterized by the oxygen being O₂.

4. The method of statement 3 or any other appropriate statement herein, wherein the step of for example (103) annealing the semiconductor layer for example (16) is performed at a lower peak temperature than the step of for example (104) annealing the globules for example (18) to form the nanocrystals for example (34).

5. The method of statement 4 or any other appropriate statement herein, wherein the step of for example (105) depositing semiconductor material comprises applying disilane to the globules for example (18).

6. The method of statement 2 or any other appropriate statement herein, wherein the steps of:
   for example (102) depositing the semiconductor layer;
   for example (103) annealing the semiconductor layer;
   for example (104) annealing the globules from the semiconductor material;
   for example (105) depositing semiconductor material;
   for example (106) annealing the globules to form the nanocrystals; and
   for example (107) annealing the nanocrystals;
   are performed in-situ.

7. The method of statement 1 or any other appropriate statement herein, wherein the step of for example (102) depositing the semiconductor layer for example (16) is further characterized by the semiconductor layer being amorphous silicon.

8. The method of statement 7 or any other appropriate statement herein, wherein the step of depositing semiconductor material is further characterized by the semiconductor material comprising silicon.

9. The method of statement 8 or any other appropriate statement herein, wherein the step of for example (103) annealing the semiconductor layer for example (16) forms a second plurality of globules for example (24) from the semiconductor layer, wherein the globules of the second plurality of globules have a sufficiently small diameter so as to be completely oxidized during the step of for example (106) annealing the globules of semiconductor material.

10. The method of statement 1 or any other appropriate statement herein, wherein the insulating layer for example (14) comprises one of a group consisting of oxide and oxynitride.

11. The method of statement 1 or any other appropriate statement herein, wherein the step of for example (103) annealing the semiconductor layer for example (16) causes the globules for example (18) to be separated by a distance that ensures that the nanocrystals for example (34) are sufficiently separated after the step of for example (106) annealing the globules.

12. The method of statement 1 or any other appropriate statement herein, wherein the step of for example (103) annealing the semiconductor layer for example (18) is further characterized by the globules having a density of at least 10 to the twelfth globules per centimeter squared.

13. The method of statement 12 or any other appropriate statement herein, wherein the step of for example (106) annealing the globules for example (18) results in an average diameter of the nanocrystals for example (34) of at least 170 Angstroms.

14. The method of statement 1 or any other appropriate statement herein, wherein the step of annealing the globules for example (18) results in a coverage of at least 50 percent.

15. A method of making a non-volatile memory for example (10) in and on a semiconductor substrate for example (12), comprising;
   for example (101) forming an insulating layer for example (14) over the semiconductor substrate for example (12);
   for example (102) depositing a semiconductor layer for example (16) on the insulating layer;
   for example (103) annealing the semiconductor layer to form a plurality of globules for example (18) from the semiconductor layer;
   for example (104) annealing the globules from the semiconductor layer using oxygen;
   for example (105) depositing semiconductor material on the plurality of globules for example (18) to add semiconductor material to the globules;
   after depositing the semiconductor material, for example (106) annealing the globules to form the nanocrystals;
   for example (108) forming a control gate for example (62) over the nanocrystals for example (34);
   for example (108) forming a gate dielectric for example (67) on the substrate for example (12) adjacent to the control gate for example (62);
   for example (108) forming a select gate for example (64) over the gate dielectric; and
   for example (108) forming a first source/drain region for example (70) in the substrate adjacent to the select gate for example (64) on a side of the select gate for example (64) away from the control gate for example (62) and a second source/drain region for example (72) in the substrate adjacent to the control gate for example (62) on a side of the control gate for example (62) away from the select gate for example (64).

16. The method of statement 15 or any other appropriate statement herein, wherein the step of for example (103) annealing the semiconductor layer for example (16) is further characterized by the globules for example (18) having a density of at least 10 to the twelfth globules per centimeter squared.

17. The method of statement 16 or any other appropriate statement herein, wherein the step of for example (106) annealing the globules for example (18) results in an average diameter of the nanocrystals of at least 170 Angstroms.

18. The method of statement 15 or any other appropriate statement herein, wherein the step of for example (106) annealing the globules for example (18) results in a coverage of at least 50 percent.

19. The method of statement 15 or any other appropriate statement herein, further comprising, after the step of for example (103 or 106) annealing the globules for example (18) to form the nanocrystals for example (34), for example (105 or 107) annealing the nanocrystals using oxygen.

20. A method of forming nanocrystals for example (34) over an insulating layer for example (14), comprising:
   for example (102) forming an amorphous silicon layer for example (16) over the insulating layer for example (14), wherein the insulating layer comprises one of a group consisting of oxide and oxynitride;
   for example (103) annealing the amorphous silicon layer for example (16) to form a plurality of globules for example (18) having a density of at least 10 to the twelfth globules per square centimeter;

for example (104) annealing the globules for example (18) using oxygen;

for example (105) depositing silicon on the globules for example (18); after the step of depositing silicon on the globules, for example (106) annealing the globules in an inert ambient to form nanocrystals for example (34) having an average diameter of at least 170 Angstroms; and for example (107) annealing the nanocrystals for example (34) using oxygen to form a protective coating for example (40, 46, 52) around the nanocrystals, wherein the protective coating comprises one of a group consisting of oxide and oxynitride, and wherein all of these steps are performed in-situ.

What is claimed is:

1. A method of making nanocrystals on an insulating layer, comprising:
    depositing a semiconductor layer on the insulating layer;
    annealing the semiconductor layer to form a plurality of globules from the semiconductor layer;
    annealing the globules from the semiconductor layer using oxygen;
    depositing semiconductor material on the plurality of globules to add semiconductor material to the globules; and
    after depositing the semiconductor material, annealing the globules to form the nanocrystals.

2. The method of claim 1, further comprising, after the step of annealing the globules to form the nanocrystals, annealing the nanocrystals using oxygen.

3. The method of claim 2, wherein the step of annealing the globules from the semiconductor layer using oxygen is further characterized by the oxygen being $O_2$.

4. The method of claim 3 wherein the step of annealing the semiconductor layer is performed at a lower peak temperature than the step of annealing the globules to form the nanocrystals.

5. The method of claim 4, wherein the step of depositing semiconductor material comprises applying disilane to the globules.

6. The method of claim 2 wherein the steps of:
    depositing the semiconductor layer;
    annealing the semiconductor layer;
    annealing the globules from the semiconductor material;
    depositing semiconductor material;
    annealing the globules to form the nanocrystals; and
    annealing the nanocrystals;
    are performed in-situ.

7. The method of claim 1, wherein the step of depositing the semiconductor layer is further characterized by the semiconductor layer being amorphous silicon.

8. The method of claim 7, wherein the step of depositing semiconductor material is further characterized by the semiconductor material comprising silicon.

9. The method of claim 8, wherein the step of annealing the semiconductor layer forms a second plurality of globules from the semiconductor layer, wherein the globules of the second plurality of globules have a sufficiently small diameter so as to be completely oxidized during the step of annealing the globules of semiconductor material.

10. The method of claim 1, wherein the insulating layer comprises one of a group consisting of oxide and oxynitride.

11. The method of claim 1, wherein the step of annealing the semiconductor layer causes the globules to be separated by a distance that ensures that the nanocrystals are sufficiently separated after the step of annealing the globules.

12. The method of claim 1, wherein the step of annealing the semiconductor layer is further characterized by the globules having a density of at least 10 to the twelfth globules per centimeter squared.

13. The method of claim 12, wherein the step of annealing the globules results in an average diameter of the nanocrystals of at least 170 Angstroms.

14. The method of claim 1, wherein the step of annealing the globules results in a coverage of at least 50 percent.

15. A method of making a non-volatile memory in and on a semiconductor substrate, comprising:
    forming an insulating layer over the semiconductor substrate;
    depositing a semiconductor layer on the insulating layer;
    annealing the semiconductor layer to form a plurality of globules from the semiconductor layer;
    annealing the globules from the semiconductor layer using oxygen;
    depositing semiconductor material on the plurality of globules to add semiconductor material to the globules;
    after depositing the semiconductor material, annealing the globules to form the nanocrystals;
    forming a control gate over the nanocrystals;
    forming a gate dielectric on the substrate adjacent to the control gate;
    forming a select gate over the gate dielectric; and
    forming a first source/drain region in the substrate adjacent to the select gate on a side of the select gate away from the control gate and a second source/drain region in the substrate adjacent to the control gate on a side of the control gate away from the select gate.

16. The method of claim 15, wherein the step of annealing the semiconductor layer is further characterized by the globules having a density of at least 10 to the twelfth globules per centimeter squared.

17. The method of claim 16, wherein the step of annealing the globules results in an average diameter of the nanocrystals of at least 170 Angstroms.

18. The method of claim 15, wherein the step of annealing the globules results in a coverage of at least 50 percent.

19. The method of claim 15, further comprising, after the step of annealing the globules to form the nanocrystals, annealing the nanocrystals using oxygen.

20. A method of forming nanocrystals over an insulating layer, comprising:
    forming an amorphous silicon layer over the insulating layer, wherein the insulating layer comprises one of a group consisting of oxide and oxynitride;
    annealing the amorphous silicon layer to form a plurality of globules having a density of at least 10 to the twelfth globules per square centimeter;
    annealing the globules using oxygen;
    depositing silicon on the globules;
    after the step of depositing silicon on the globules, annealing the globules in an inert ambient to form nanocrystals having an average diameter of at least 170 Angstroms; and
    annealing the nanocrystals using oxygen to form a protective coating around the nanocrystals, wherein the protective coating comprises one of a group consisting of oxide and oxynitride, and
    wherein all of these steps are performed in-situ.

* * * * *